United States Patent
Efland

(10) Patent No.: US 7,060,607 B2
(45) Date of Patent: Jun. 13, 2006

(54) CIRCUIT METHOD INTEGRATING THE POWER DISTRIBUTION FUNCTIONS OF THE CIRCUITS AND LEADFRAMES INTO THE CHIP SURFACE

(75) Inventor: Taylor R. Efland, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/154,190

(22) Filed: Jun. 16, 2005

(65) Prior Publication Data

US 2005/0248027 A1   Nov. 10, 2005

Related U.S. Application Data

(62) Division of application No. 09/975,630, filed on Oct. 12, 2001, now Pat. No. 6,972,484.

(60) Provisional application No. 60/240,452, filed on Oct. 13, 2000.

(51) Int. Cl.
H01L 23/34   (2006.01)

(52) U.S. Cl. ........................ 438/629; 438/642

(58) Field of Classification Search .............. None
See application file for complete search history.

(56) References Cited

U.S. PATENT DOCUMENTS

| | | | |
|---|---|---|---|
| 5,495,125 A * | 2/1996 | Uemura | 257/666 |
| 5,751,065 A | 5/1998 | Chittipeddi et al. | 257/758 |
| 5,965,903 A | 10/1999 | Chittipeddi et al. | 257/48 |
| 5,986,343 A | 11/1999 | Chittipeddi et al. | 257/758 |
| 6,033,937 A | 3/2000 | Manteghi | 438/124 |
| 6,229,221 B1 * | 5/2001 | Kloen et al. | 257/784 |

FOREIGN PATENT DOCUMENTS

WO    WO 00/35013    6/2000

OTHER PUBLICATIONS

Wolf et al, Silicon Processing for the VLSI Era, 2000, vol. 1, Lattice Press, 716-727 & 791-795.

* cited by examiner

Primary Examiner—Leonardo Andújar
(74) Attorney, Agent, or Firm—Wade James Brady, III; Frederick J. Telecky, Jr.

(57) ABSTRACT

An integrated circuit (IC) chip, mounted on a leadframe, has a network of power distribution lines deposited on the surface of the chip so that these lines are located over active components of the IC, connected vertically by metal-filled vias to selected active components below the lines, and also by conductors to segments of the leadframe.

The network relocates most of the conventional power distribution interconnections from the circuit level to the newly created surface network, thus saving substantial amounts of silicon real estate and permitting shrinkage of the IC area.

The network is electrically connected to selected active components by metal-filled vias; since these vias can easily be redesigned to other locations, IC designers gain a new degree of design freedom.

The network relocates most of the bond pads dedicated to power supply from the conventional alignment along the chip periphery onto the newly created bondable lines, saving substantial additional amounts of silicon real estate, and freeing the bonding machines from their extremely tight connector placement and attachment rules to much more relaxed bonding programs.

The network is deposited and patterned in wafer processing as a sequence of metal layers specifically suited for providing power current and electrical ground potential. The network has attachable outermost metal surface and is laid out so that network portions form pads convenient for attaching balls of bonding wires or solder.

4 Claims, 1 Drawing Sheet

CIRCUIT METHOD INTEGRATING THE POWER DISTRIBUTION FUNCTIONS OF THE CIRCUITS AND LEADFRAMES INTO THE CHIP SURFACE

This is a divisional application of application Ser. No. 09/975,630 filed Oct. 12, 2001 now U.S. Pat No. 6,972,484, which claims priority under 35 USC 119(e) of provisional application No. 60/240,452 filed Oct. 13, 2000, the contents of which are herein incorporated by reference in its entirety.

FIELD OF THE INVENTION

The present invention is related in general to the field of semiconductor devices and processes, and more specifically to integrated circuits that enable integration of the power distribution function of leadframes into the chip surface.

DESCRIPTION OF THE RELATED ART

The leadframe for semiconductor devices was invented (U.S. Pat. Nos. 3,716,764 and 4,034,027) as a pre-fabricated low-cost part to serve several needs of semiconductor devices and their operation simultaneously: First of all, the leadframe provides a stable support pad for firmly positioning the semiconductor chip, usually an integrated circuit (IC) chip. Since the leadframe including the pad is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the bond pads on the IC surface are typically bridged by thin metallic wires, individually bonded to the IC contact pads and the leadframe segments. As a consequence of this solution, the segments, bond pads and connecting wires have fixed relative locations, once the device design has been finalized, and the bond pads cannot be rearranged at convenience in order to facilitate some IC re-layout.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering.

It has been common practice to manufacture single piece leadframes from thin (about 120 to 250 µm) sheets of metal. For reasons of easy manufacturing, the commonly selected starting metals are copper, copper alloys, iron-nickel alloys for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

It has further been common practice to dedicate a plurality of segments for carrying the electrical signals to designated chip inputs/outputs, and dedicate another plurality of segments for supplying the power currents to designated chip inputs/outputs.

Two independent trends in semiconductor technology, both with a long history, contribute to the urgency for the present invention. The first technology trend concerns the rapidly growing demand for more and more chip signal and power terminals and thus leadframe segments. Leadframes of ever finer segment dimensions have been introduced. However, they simply have been overwhelmed by the even more rapidly growing demand for more and more numerous and more closely spaced bond pads on the chip. This trend causes ever tighter constraints on all bond and wire dimensions combined with extremely tight accuracy requirements for attaching the ball bond and stitch bond welds. This trend is now pushing against the limits of technical feasibility.

The second technology trend concerns manufacturing cost savings by conserving semiconductor "real estate". In order to accommodate balls of bonding wires or solder, typical bond pads on silicon ICs have to be of sufficient size; they typically range from squares of 45×45 µm to squares of 150×150 µm. They consume, therefore, an area between approximately 1 and 20%, sometimes up to 45%, of the circuit area, dependent on the number of bonding pads and the size of the IC. For manufacturing and assembly reasons, the bond pads are arranged in rows along the periphery of the circuit, usually stringed along all four chip sides.

Until now, all semiconductor devices manufactured had to exclude the area covered by the bond pads from use for laying out actual circuit patterns because of the high risk of damaging the circuit structures due to the unavoidable mechanical forces and metallurgical stresses needed in the bonding process. Evidently, considerable savings of silicon real estate can be obtained if circuit patterns could be placed under the bond pad metal. One way to achieve this feature would be to create another level of metallization dedicated primarily to bonding pad formation. This level would be built over a protective overcoat covering an active circuit area. In existing technology, however, a special stress buffer layer of expensive polyimide has to be applied between the protective overcoat and the extra metal layer, as shown by K. G. Heinen et al. ("Wire Bonds over Active Circuits", Proc. IEEE 44th Elect. Comp. Tech. Conf., 1994, pp. 922–928).

A different approach in existing technology has been proposed in U.S. Patent Application No. 60/092,961, filed Jul. 14, 1998 (Saran, "System and Method for Bonding Over Active Integrated Circuits"). In order to make the bonding pads strong enough to withstand the mechanical forces required in the wire bonding process, reinforcing systems under the bonding pad are described which utilize specific portions of the actual IC as the means to reinforce weak dielectric layers under the bond pad. This method requires specific design or redesign of the IC and is poorly suited for standard linear and logic ICs which often have numerous bond pads but relatively small circuit areas.

Another approach to forming bonds over active circuit portions is described in U.S. patent applications Ser. No. 08/959,410, filed on Oct. 28, 1997, Ser. No. 09/611,623, filed on Jul. 07, 2000 (Shen et al., "Integrated Circuit with Bonding Layer over Active Circuitry"), and Ser. No. 60/221,051, filed on Jul. 27, 200 (Efland et al., "Integrated Power Circuits with Distributed Bonding and Current Flow"), to which the present invention is related. Vias to the top metallization layer of the circuit are coated with seed metal and then plated with successive metal layers, thereby filling the vias and forming stress-absorbing attachment surfaces for wire bonds or solder balls.

Another approach to forming bonds over active circuit portions is described in U.S. patent application Ser. No. 09/458,593, filed on Dec. 10, 1999 (Zuniga et al., "System and Method for Bonding over Integrated Circuits"), to which the present invention is related. A combination of bondable and stress-absorbing metal layers, and a mechanically strong, electrically insulating layer separate a bond pad and a portion of the integrated circuit located under the bond pad. None of these approaches of forming bonds over active circuits propose a fundamental solution to the conflicting problems of fine-pitch bond pads, fine-pitch leadframes, tightly constrained bond manufacturability, and improved device performances. An urgent need has therefore arisen for a low-cost, reliable structure and method combining savings of silicon real estate with relaxed manufacturability of wire and solder ball bonding, relaxed leadframe designs, freedom of IC layout coupled with significant improvements of IC characteristics. The system should provide stress-free, simple, and no-cost-added contact pads for flexible, tolerant bonding processes even when the contact pads are situated above one or more structurally and mechanically weak dielectric layers. The system and method should be applicable to a wide spectrum of design, material and process variations, leading to significant savings of silicon, as well as to improved device characteristics and reliability and process yield. Preferably, these innovations should be accomplished using the installed process and equipment base so that no investment in new manufacturing machines is needed.

SUMMARY OF THE INVENTION

An integrated circuit (IC) chip, mounted on a leadframe, has a network of power distribution lines deposited on the surface of the chip so that these lines are located over active components of the IC, connected vertically by metal-filled vias to selected active components below the lines, and also by conductors to segments of the leadframe.

The deposited and patterned network of bondable lines provides a umber of significant advantages.

The network relocates most of the conventional power distribution interconnections from the circuit level to the newly created surface network, thus saving substantial amounts of silicon real estate and permitting shrinkage of the IC area.

The network is electrically connected to selected active components by metal-filled vias; since these vias can easily be redesigned to other locations, IC designers gain a new degree of design freedom.

The network relocates most of the bond pads dedicated to power supply from the conventional alignment along the chip periphery onto the newly created bondable lines, saving substantial additional amounts of silicon real estate, and freeing the bonding machines from their extremely tight connector placement and attachment rules to much more relaxed bonding programs.

The network is deposited and patterned in wafer processing as a sequence of metal layers specifically suited for providing power current and electrical ground potential.

As preferred embodiments of the invention, the lines of the network, with attachable outermost surface, are laid out so that they form pads at locations convenient for attaching balls of bonding wires or solder.

In a preferred embodiment of the invention, the chip of a semiconductor device has an integrated circuit fabricated on the first chip surface ("active" surface); the circuit comprises active components, at least one metal layer, and a protection by a mechanically strong, electrically insulating overcoat which has a plurality of metal-filled vias to contact said at least one metal layer, and a plurality of windows to expose circuit contact pads. The chip further has a stack of electrically conductive films deposited on the overcoat; the films are patterned into a network of lines substantially vertically over the active components. The stack has a bottom-most film in contact with the vias, at least one stress-absorbing film, and an outermost film which is non-corrodible and metallurgically attachable. The network is patterned to distribute power current and ground potential. The second ("passive") surface of the chip is attached to the mount pad of a leadframe, which also has a first plurality of segments providing electrical signals, and a second plurality of segments providing electrical power and ground. Electrical conductors are connecting the chip contact pads with said the plurality of segments, and electrical conductors are connecting the network lines with the second plurality of segments.

It is an aspect of the present invention to reduce the cost of IC chips by reducing the silicon areas consumed by the circuit power distribution lines, as well as by the chip contact pads for power connections.

Another aspect of the invention is to gain a new degree of circuit design flexibility by enabling the power connection to active components in geometrically shortest path and at no penalty for redesign.

Another aspect of the invention is to improve assembly manufacturability by relaxing the tight placement rules for ball attachment in wire bonding and solder bonding.

Another aspect of the invention is to reduce the number of leadframe segments required for power input/output by delegating the majority of the power distribution function of leadframes to the innovative network of power distribution lines positioned on the chip surface.

Another aspect of the present invention is to advance the process and operation reliability of semiconductor probing, and wire bonded and solder-attached assemblies by providing the pad metal layers, and insulating layers separating the contact pad and the circuit, in thicknesses sufficient to reliably absorb mechanical, thermal and impact stresses.

Another aspect of the invention is to eliminate restrictions on the processes of probing and of wire bonding and solder attachment, thus minimizing the risks of inflicting cracking damage even to very brittle circuit dielectrics.

Another aspect of the invention is to provide design and layout concepts and process methods which are flexible so that they can be applied to many families of semiconductor IC products, and are general, so that they can be applied to several generations of products.

Another aspect of the invention is to provide a low-cost and high-speed process for fabrication, testing and assembly.

Another aspect of the invention is to use only design concepts and processes most commonly used and accepted in the fabrication of IC devices, thus avoiding the cost of new capital investment and using the installed fabrication equipment base.

These aspects have been achieved by the teachings of the invention concerning design concepts and process flow suitable for mass production. Various modifications have been successfully employed to satisfy different selections of product geometries and materials.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent applications Ser. No. 08/959,410, filed on Oct. 28, 1997, Ser. No. 09/611,623, filed on Jul. 07, 2000 (Shen et al., "Integrated Circuit with Bonding Layer over Active Circuitry"), and Ser. No. 60/221,051, filer on Jul. 27, 200 (Efland et al., "Integrated Power Circuits with Distributed Bonding and Current Flow"), which are herewith incorporated by reference.

Figure 1:
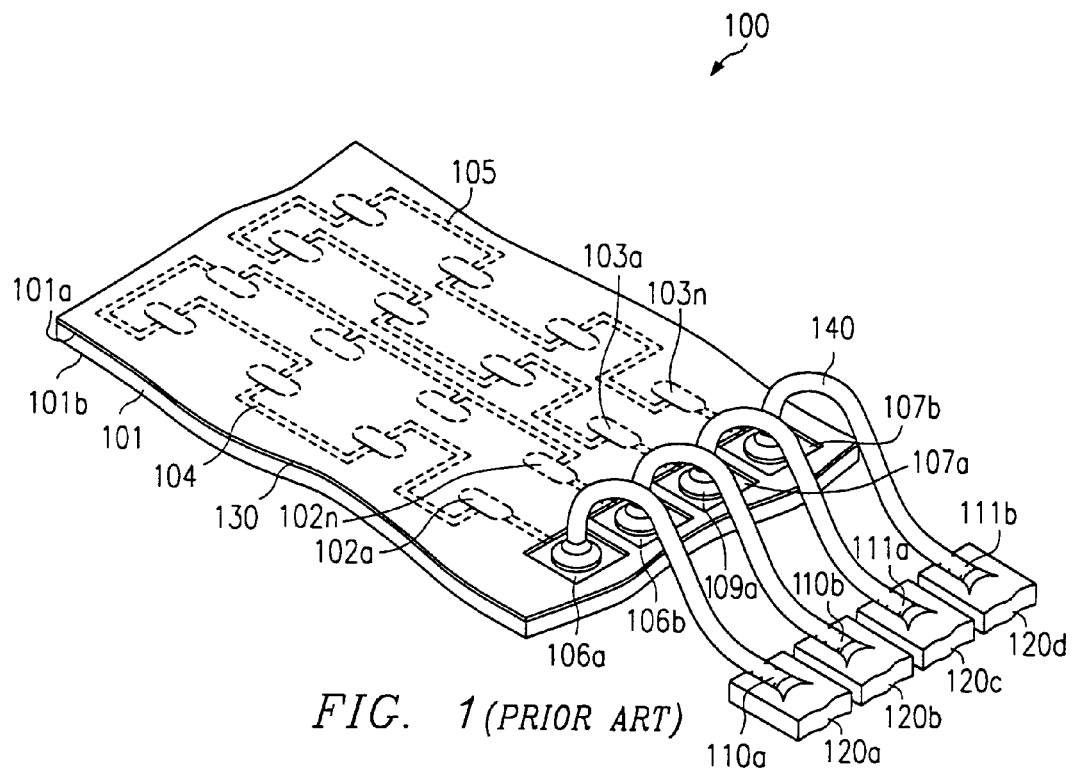
FIG. 1 is a simplified and schematic perspective view of a portion of an integrated circuit chip having bonding wires attached to bond pads and connected to portions of a leadframe, according to prior art.

The impact of the present invention can be most easily appreciated by highlighting the shortcomings of the known technology. FIG. 1 shows a simplified and schematic perspective view of a portion of an integrated circuit (IC) chip, generally designated 100, with design and fabrication features of the prior art. Semiconductor substrate 101 (usually silicon, between about 225 and 475 µm thick) has a first ("active") surface 101a and a second ("passive") surface 101b. The second surface 101b is attached to the chip mount pad not shown in FIG. 1) of a prefabricated leadframe (typically copper, copper alloy, or iron-nickel alloy, about 100 to 300 µm thick). Of the plurality of leads (usually 14 to over 600), FIG. 1 depicts only the tips 120a, 120b, . . . of a few inner leads of the leadframe, which are employed for power supply.

Embedded in the first surface 101a of the chip is a plurality of active components of the IC (in modern ICs, the number of active components is large, often in excess of one million, yet miniaturized in lateral and vertical dimensions). Further included in surface 10a is at least one metallization layer (usually pure or alloyed aluminum, between 0.4 and 1.5 µm thick; in some ICs, there is a hierarchy of more than six metallization layers). The metal is patterned in lines connecting the active and passive components and contact pads of the IC. For metal lines conducting the electrical power, the line width typically ranges from about 20 to 250 µm. Schematically depicted in FIG. 1 is a small portion of the metallization, patterned as the layout for meandering lines distributing electrical power between active components and contact pads.

For illustration purposes, the active components depicted in FIG. 1 are grouped into two separate electrical loops. One loop comprises the active components designated 102a through 102n; the other loop comprises the active components 103a through 103n. The interconnection power lines 104 and 105 are organizing the two loops, respectively. Loop 104 has two terminals 106a and 106b, which are fabricated as contact pads suitable for electrical conductors to connect the contact pads with the lead tips 110 of the leadframe. Dependent on the device of the types most frequently produced, the number of contact pads per chip may vary from 14 and more than 600. In FIG. 1, wire bonding (usually gold wire, about 20 tc 28 µm diameter) is chosen as the means for electrical interconnection. Balls 108a and 108b are attached to contact pads 106a and 106b, respectively, and stitches 110a and 110b are attached to lead tip 120a and 120b, respectively. Similarly, loop 105 has two terminals 107a and 107b, which also are fabricated as contact cads for wire ball bonding. Balls 109a and 109b are attached to contact pads 107a and 107b, respectively, and stitches 111a and 111b are attached to lead tips 120c and 120d, respectively. In order to avoid problems of wire sagging or wire sweep, the length of the wire span 140 is preferably kept less than 2.5 mm.

As indicated in FIG. 1, the first surface 101a of the semiconductor substrate 101 is uniformly covered with a protective overcoat 130. The contact pads 106a, 106b etc. are opened as windows in this overcoat. Typically, the overcoat is between 0.8 and 1.2 µm thick, mechanically strong, electrically insulating, and usually moisture-impenetrable; preferred materials include silicon nitride and silicon oxy-nitride.

For operating the signal inputs/outputs of the IC, additional windows in the protective overcoat are needed to expose the underlying contact pad metallization. These windows and their respective wire bond are not shown in FIG. 1.

As can be deduced from FIG. 1, there are a number of problems and limitations, which the known technology imposes on IC design, leadframe and device design, fabrication processes, and product manufacturability.

Placing the power input/output terminals around the chip periphery necessitates the current difficulties
   to interconnect active circuit components by lengthy electrical power lines;
   to compensate for unavoidable voltage drops along the power distribution lines;
   to accept inflexible design rules for positioning active IC components; and
   to accept loss of precious silicon real estate.
Placing a high number of bond pads around the chip periphery consumes precious silicon real estate.
Placing a high number of bond pads around the chip periphery necessitates the current trend
   to shrink of the bond pad area;
   to shrink of the bond pad pitch;
   to shrink the wire balls so that they fit into the educed bond pad area; and
   to tighten the programs of the automated bonders in order to center the balls precisely in the pad areas.
Pre-fabricating leadframes of ever increasing numbers of leads causes the current difficulties
   to shrink the width of the inner leads;
   to shrink the pitch of the inner leads; and
   to place the stitch bonds on the minimized inner leads.

Figure 2:
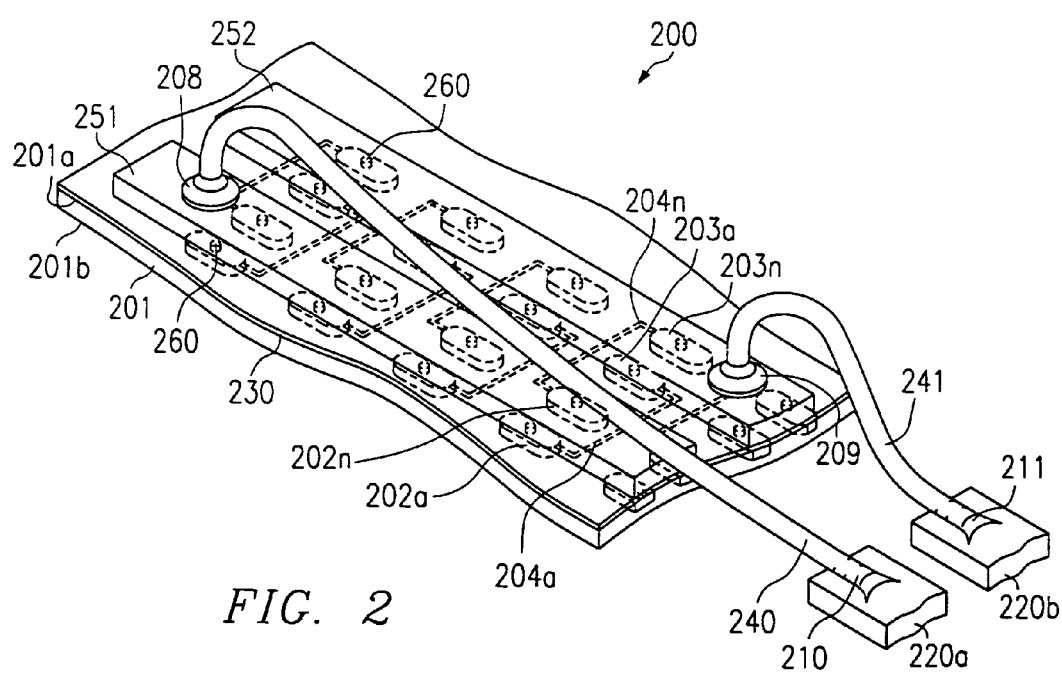
FIG. 2 is a simplified and schematic perspective view of a portion of an integrated circuit chip having a surface structure integrating the power distribution functions of circuit and leadframe, according to the invention.

FIG. 2 summarizes the innovations of the present invention in order to remedy the above-listed shortcomings of the known technology. FIG. 2 is a simplified and schematic perspective view of a portion of an IC chip, generally designated 200, with design and fabrication features disclosed by the present invention. Semiconductor substrate 201 has a first ("active") surface 201a and a second ("passive") surface 201b. The second surface 201b is attached to the chip mount pad (not shown in FIG. 2) of a prefabricated leadframe (typically copper, copper alloy, iron-nickel alley, invar, or aluminum, about 100 to 300 µm thick). Of the plurality of leads (usually 14 up to over 600), FIG. 2 depicts only the tips 220a and 220b of a few leadframe segments, which are employed for power supply and located in the proximity of the IC chip.

Embedded in the first surface 201a of the chip is a plurality of active components of the IC (in modern ICs, the number of active components is large, often in excess of one million, yet miniaturized in lateral and vertical dimensions). According to this invention, the active components 202a through 202n and 203a through 203n shown in FIG. 2 are organized according to the power supply they share, to the extent the IC functions permit this. All active components 202a through 202n share one power current terminal (for instance, the input terminal), all active components 203a through 203n share the other terminal (for instance, the output terminal). In FIG. 2, the power current flows from component 202a to component 203a, . . . , and from component 202n to component 203n. The interconnecting lines are indicated in FIG. 2 by dashed contours. For example, the interconnection from active component 202a to active component 203a is designated 204a; . . . ; the interconnection from active component 202n to component 203n is designated 204n.

As indicated in FIG. 2, the first surface 201a of the semiconductor substrate 201, and thus the IC embedded in this surface, is uniformly covered with a protective overcoat 230. Preferably, the overcoat is between 0.4 and 1.5 µm thick, mechanically strong, electrically insulating, and impenetrable for moisture. Preferred materials include silicon nitride, silicon oxy-nitride, silicon carbon alloys and sandwiched films thereof. In some applications, a polyimide layer can be used.

It is pivotally important for the present invention that the network of power distribution lines is deposited on the exposed surface of the protective overcoat 230, located directly and substantially vertically over the active components of the IC. In FIG. 2, one of the power distribution lines shown is designated 251, another one shown is designated 252. The material structure and composition, as well as fabrication process are described below.

Furthermore, it is crucially important for the present invention that selected active components below the power distribution lines are conductively and vertically connected to the power lines. Preferably, this connection is provided by metal-filled vias 260 which are in contact with the metallization of the active components and with the power distribution lines. The vias 260 are formed by patterning and etching the overcoat 230, using standard photolithographic techniques. The vias are then filled with metal in conjunction with the deposition of the power line metallization described below.

The outermost metal of the deposited lines 251 and 252 is selected from a material which is bondable (and solderable, see below). Electrical conductors connect this outermost metal with the lead tips of the leadframe. In FIG. 2, wire bonding (the wire is preferably pure or alloyed gold, copper, or aluminum with a diameter of about 20 to 30 µm) is chosen as the preferred technique for electrical interconnection. Balls 208 and 209 are attached to lines 251 and 252, respectively, and stitches 210 and 211 are attached to lead tips 220a and 220b, respectively. It is important for the present invention that recent technical advances in wire bonding now allow the formation of tightly controlled wire loops and loop shapes. By way of example, loop 240 in FIG. 2 is shown much more elongated than loop 241. Wire lengths of 7.5 mm or even more are achievable with today's bonders. Such advances can, for instance, be found in the computerized bonder 8020 by Kulicke & Soffa, Willow Grove, Pa., U.S.A., or in the ABACUS SA by Texas Instruments, Dallas, Tex., U.S.A. Moving the capillary in a predetermined and computer-controlled manner through the air will create a wire looping of exactly defined shape. For instance, rounded, trapezoidal, linear and customized loop paths can be formed.

The preferred structure of the deposited power distribution metallization for lines 251 and 252 consists of a seed metal layer attached to the protective overcoat 230 and the bottoms of the vias 260, followed by a first relatively thin stress-absorbing metal layer, a second, relatively thick stress absorbing layer, and finally an outermost bondable metal layer. Preferably, the seed metal layer is selected from a group consisting of tungsten, titanium, titanium nitride, molybdenum, chromium, and alloys thereof. The seed metal layer is electrically conductive, provides adhesion to both the metallization of the IC active components and the protective overcoat, permits the exposed portions of its upper surface to be electroplated, and prevents migration of the subsequent stress-absorbing metals to the components metallzation layers. The thickness of seed metal layer is between about 100 and 500 nm. Alternatively, the seed metal layer may be composed of two metal layers; an example for the second metal is copper, since it provides a suitable surface for subsequent electroplating.

It should be pointed out for the present injection that a single seed layer can preferably be made of refractory metal which has a thickness large enough to reliably act as a stress-absorbing buffer. Thicknesses between about 200 and 500 nm, preferably about 300 nm, are satisfactory. The thickness for optimum stress absorption depends not only on the selected metal, but also on the deposition technique selected, the rate of deposition, and the temperature of the silicon substrate during the time of deposition, since these parameters determine the microcrystallinity of the deposited layer. It has been found, for instance, that when using sputter deposition of tungsten, the layer formation is preferably performed at a rate of about 4 to 5 nm/s onto a silicon substrate at ambient temperature, increasing to about 70° C. when a thickness of at least 300 nm is reached. The tungsten microcrystals thus created have an average size and distribution such that they act reliably as stress-absorbing "springs" during the wire bonding process in assembly.

For depositing the stress-absorbing layers, it is advantageous to employ an electroplating process. An example for the first stress-absorbing metal layer is copper. Its thickness in the range from about 2 to 35 µm makes it a mechanically strong support layer for subsequent attachment of connecting conductors such as bonding wires. An example for the second stress-absorbing metal layer is nickel in the thickness range from bout 1 to 5 µm.

The outermost layer is metallurgically bondable and/or solderable. If wire bonding is the connecting method selected (as shown in FIG. 2) and the outermost layer should be bondable, favorable metal choices include pure or alloyed aluminum, gold, palladium, and silver. If soldering is the connecting method selected and the outermost layer should be solderable, favorable metal choices include palladium, gold, silver and platinum. In both cases, the thickness is in the 500 to 2800 nm range. It is understood that the number of layers, the choice of materials and their thicknesses, and the deposition processes can be varied in order to suit specific device needs.

The plating pattern of the network or distribution lines may form any desired layout. As can be seen in the example of FIG. 2, the connector line pattern may have an elongated or linear form. It is its function, however, to extend vertically over the vias to the component metallization. Otherwise, it may extend geometrically beyond the direct area of the vias and expand, for instance, into a widened part offering sufficient surface area for accommodating extra large-diameter bonding wire or solder balls hose attachment "pads" may then be equally well suited for attaching a wedge bond or a switch bond.

As pointed out above, the outermost line layer may be selected so that it is solderable. A solder ball can then be attached to it by standard reflow techniques. However, it was described in the above-cited U.S. patent applications Ser. Nos. 09/611,623 and 60/221,051 that it is often advisable to employ an additional solder mask or polyimide layer with an opening for each solder ball in order to keep the flip-chip bump in a defined area and shape during bump formation and subsequent attachment to an external package or board.

It should be mentioned that the positioning of the distribution lines can be exploited to improve the dissipation of thermal energy released by the active components of the IC. This is especially true when solder bumps are employed as connecting means to the "outside world", minimizing the thermal path and thermal resistance for heat dissipation.

For operating the signal inputs/outputs of the IC, additional windows in the protective overcoat are needed to expose the underlying contact pad metallization. Wire bond or solder balls can then be affixed to these contact windows. These windows and their respective wire bonds are not shown in FIG. 2.

It should further be mentioned that at least some lines and portions of the distribution network deposited over the protective overcoat may be patterned and dedicated to provide distribution for electrical ground potential.

OTHER EMBODIMENTS

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention covers integrated circuits made in substrates of silicon, silicon germanium, gallium arsenide, or any other semiconductor material used in integrated circuit manufacture.

As another example, the invention covers generally a semiconductor integrated circuit which comprises a circuit structure integrating into the IC chip surface the power distribution functions of the circuit as well as the means for connecting to other parts or the "outside world". The position of the power distribution lines are selected so that they provide control and distribution of the power current to the active components preferably vertically below the distribution lines.

It is therefore intended that the appended claims encompass any such modifications or embodiments.

I claim:

1. A method for fabricating a semiconductor device including a semiconductor chip having first and second surfaces, comprising the steps of:
   providing a semiconductor chip having first and second opposing chip surfaces;
   forming an integrated circuit on the first chip surface, said circuit including active components, contact pads, at least one metal layer, and a mechanically strong, electrically insulating protective overcoat;
   forming a plurality of vias through said overcoat to access said at least one metal layer;
   depositing a stack of coplanar metal films on said overcoat contacting said at least one metal layer, said stack filling said vias and having at least one stress-absorbing film and an outermost being non-corrodible and metallurgically attachable film, said films having an electrically conductive seed metal layer attached to said electrically insulating overcoat and said metal-filled vias, at least one stress absorbing film over said seed metal layer of sufficient thickness to reliably absorb mechanical, thermal and impact stresses and an outercoat non-corrodable and metallurgically attachable electrically conductive layer;
   patterning said films into a network of lines such that said lines are located substantially vertically over said active components and are suitable for power current distribution;
   forming a plurality of windows in said overcoat to expose circuit contact pads;
   providing a pre-fabricated leadframe comprising a chip mount pad, a first plurality of segments suitable for electrical signals, and a second plurality of segments suitable for electrical power and ground;
   attaching said chip to said chip mount pad;
   attaching electrical conductors to said circuit contact pads and said first plurality of segments; and
   attaching electrical conductors to said network of lines and said second plurality of segments.

2. The method according to claim 1 wherein said steps of attaching electrical conductors to said contact pads and said network of lines comprise the step of either bonding wires or ribbons to said contact pads and network of lines, or reflowing solder balls to said contact pads and network of lines.

3. The method according to claim 1 further comprising the step of encapsulating said chip, chip mount pad, electrical conductors and at least a portion of said leadframe segments in a package.

4. The method according to claim 1 further comprising the step of attaching said circuit contact pads and said network of lines to outside parts by solder balls.

* * * * *